(12) United States Patent
McCaffrey et al.

(10) Patent No.: US 8,680,642 B2
(45) Date of Patent: *Mar. 25, 2014

(54) HIGHLY-DEPLETED LASER DOPED SEMICONDUCTOR VOLUME

(75) Inventors: Nathaniel J. McCaffrey, Hampton Falls, NH (US); James E. Carey, Waltham, MA (US)

(73) Assignee: Sionyx, Inc., Beverly, MA (US)

( * ) Notice: Subject to any disclaimer, the term of this patent is extended or adjusted under 35 U.S.C. 154(b) by 8 days.

This patent is subject to a terminal disclaimer.

(21) Appl. No.: 13/430,508

(22) Filed: Mar. 26, 2012

(65) Prior Publication Data

US 2013/0075852 A1  Mar. 28, 2013

Related U.S. Application Data

(63) Continuation of application No. 12/782,449, filed on May 18, 2010, now Pat. No. 8,143,688, which is a continuation of application No. 12/362,078, filed on Jan. 29, 2009, now Pat. No. 7,745,901.

(51) Int. Cl.
*H01L 31/102* (2006.01)

(52) U.S. Cl.
USPC ............ 257/461; 257/449; 257/E31.092

(58) Field of Classification Search
USPC ............ 257/449, 463, E31.093, 461, 464, 257/E31.092, E23.092
See application file for complete search history.

(56) References Cited

U.S. PATENT DOCUMENTS

| | | | |
|---|---|---|---|
| 3,487,223 A | 12/1969 | St. John | |
| 4,201,450 A | 5/1980 | Trapani | |
| 4,277,793 A | 7/1981 | Webb | |
| 4,663,188 A | 5/1987 | Kane | |
| 4,965,784 A | 10/1990 | Land et al. | |
| 5,322,988 A | 6/1994 | Russell et al. | |
| 5,731,213 A | 3/1998 | Ono | |
| 5,773,820 A | 6/1998 | Osajda et al. | |
| 7,057,256 B2 | 6/2006 | Carey, III et al. | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 7,456,452 B2 | 11/2008 | Wells et al. | |
| 7,482,532 B2 | 1/2009 | Yi et al. | |
| 7,511,750 B2 | 3/2009 | Murakami | |

(Continued)

FOREIGN PATENT DOCUMENTS

WO  WO 2008091242  7/2008

OTHER PUBLICATIONS

Carey et al., "Femtosecond-Laser-Assisted Microstructuring of Silicon Surfaces", Optics and Photonics News, 2003. 14, 32-36.

(Continued)

*Primary Examiner* — Roy Potter
(74) *Attorney, Agent, or Firm* — Thorpe North & Western LLP

(57) ABSTRACT

A device with increased photo-sensitivity using laser treated semiconductor as detection material is disclosed. In some embodiments, the laser treated semiconductor may be placed between and an n-type and a p-type contact or two Schottky metals. The field within the p-n junction or the Schottky metal junction may aid in depleting the laser treated semiconductor section and may be capable of separating electron hole pairs. Multiple device configurations are presented, including lateral and vertical configurations.

17 Claims, 7 Drawing Sheets

(56) References Cited

U.S. PATENT DOCUMENTS

| | | | |
|---|---|---|---|
| 7,745,901 B1* | 6/2010 | McCaffrey et al. | 257/449 |
| 2006/0231914 A1 | 10/2006 | Carey, III et al. | |
| 2008/0258604 A1 | 10/2008 | Mazur et al. | |
| 2010/0143744 A1 | 6/2010 | Gupta | |
| 2010/0219506 A1 | 9/2010 | Gupta | |
| 2011/0266644 A1 | 11/2011 | Yamamura et al. | |
| 2011/0303999 A1 | 12/2011 | Sakamoto et al. | |

OTHER PUBLICATIONS

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Chien et al, "Pulse Width Effect in Ultrafast Laser Processing of Materials," Applied Physics A, 2005, 1257-1263, 81, Springer Berlin, Heidelberg, Germany.

Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.

Crouch et al., "Comparison of Structure and Properties of Femtosecond and Nanosecond Laser-Structured Silicon" Appl. Phys. Lett., 2004, 84,1850-1852.

Crouch et al., "Infrared Absorption by Sulfur-Doped Silicon Formed by Femtosecond Laser Irradiation", Appl. Phys. A, 2004, 79, 1635-1641.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Microstructuring of Silicon with Femtosecond Laser Pulses," Applied Physics Letters, 1998, 1673-1675, vol. 73, No. 12, American Institute of Physics.

Her et al., "Novel Conical Microstructures Created in Silicon With Femtosecond Laser Pulses", CLEO 1998, 511-512, San Francisco, CA.

Her, et al., "Femtosecond laser-induced formation of spikes on silicon," Applied Physics A, 2000, 70, 383-385.

Hu et al.; "Solar Cells from Basic to Advanced Systems;" McGraw Hill Book Co., 1983, 39, New York, New York.

Nayak et al.; "Ultra-Laser-Assisted Chemical Restructuring of Silicon and Germanium Surfaces," 2007, Applied surface Science, 253, 680-6583, Elsevier B.V.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Pain, Bedabrata; "A Back-Illuminated Megapixel CMOS Image Sensor"; http://hd1.handle.net/2014/39312; May 1, 2005.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Pedraza et al., "Surface Nanostructuring of Silicon", Appl. Phys. A, 2003, 77, 277-284.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Serpenguzel et al.; "Temperature Dependence of Photluminescence in Non-Crystalline Silicon"; Photonics West (San Jose, CA 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Younkin et al., "Infrared Absorption by Conical Silicon Microstructures Made in a Variety of Background Gases Using Femtosecond-Laser Pulses", J. Appl. Phys., 93, 2626-2629 (2003).

Younkin, "Surface Studies and Microstructure Fabrication Using Femtosecond Laser Pulses," Thesis presented to the Division of Engineering & Applied sciences at Harvard University (Aug. 2001).

Zhang et al.; "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

Carey, III; "Femtosecond-laser Microstructuring of Silicon for Novel Optoelectronic Devices"; Harvard University, Jul. 2004; (Thesis).

Kim et al.; "Strong Sub-Band-Gap Infrared Absorption in Silicon Supersaturated with Sulfur"; 2006 Appl. Phys. Lett. 88, 241902-1-241902-3.

Tabbal et al., "Formation of Single Crystal Sulfur Supersaturated Silicon Based Junctions by Pulsed Laser Melting". 2007, J. Vac. Sci. Technol. B25(6), 1847-1852.

* cited by examiner

HIGHLY-DEPLETED LASER DOPED SEMICONDUCTOR VOLUME

PRIORITY DATA

This application is a continuation of U.S. patent application Ser. No. 12/782,449, filed on May 18, 2010 now U.S. Pat. No. 8,143,688, which is a continuation of U.S. patent application Ser. No. 12/362,078, filed Jan. 29, 2009 now U.S. Pat. No. 7,745,901, both of which are incorporated herein by reference.

TECHNICAL FIELD

The present disclosure relates to systems and methods for configuring an enhanced photodiode with increased photosensitivity. In particular, the disclosure relates to an enhanced photodiode using laser treated semiconductor as detection material that separates electron hole pairs using an electric field generated by a variety of sources, including p-n junctions and Schottky junctions.

BACKGROUND OF THE INVENTION

The design of a sensitive photodetective element involves consideration of photon absorption, excitor or electron hole pair (EHP) generation and EHP separation. For example, the materials in a silicon p-n junction or a Schottky metal junction are generally good absorbers of visible light radiation. That is, devices incorporating p-n junctions or Schottky metal junctions provide high rates of photon absorption. With the absorption of each photon, there is a probability that the absorbed photon will generate an EHP. If the DIP is generated in the depletion region of the junction, the applied or built in electric field will cause the EHP constituents to drift in opposite directions due to the opposing electric charge signs. If the EHP is not separated by an electric field, the probability is increased that the electron and hole will recombine and reduce the photodetective efficiency of the device.

SUMMARY OF THE INVENTION

The doping of silicon using an ultrafast femtosecond laser has been shown to impart effective photon absorption capabilities, extend the absorption spectral cutoff, and decrease the optical absorption coefficient. Doping during laser ablation and rapid cooling may cause self forming nanocrystals comprising a combination of dopant, substrate, and impurities that allow these characteristics of laser-doped semiconductors. The high concentration of localized nanocrystals can form quantum confinement in the form of quantum wells or quantum dots. In these cases, the confinement of charges is discretized to certain energy levels within the bandgap of the substrate. If the concentration and distribution of these quantum structures is optimized, an intermediate band is formed within the bandgap and a plurality of Fermi levels (e.g., three) are defined. Structures of these types can decrease the optical absorption coefficient and extend the optical cutoff wavelength of a photodetector. A device designed to optimize the efficient collection of EHPs in such a structure may provide an electric field to separate the positive and negative charge carriers within the device. Therefore, an applied field across the photodetective volume promotes an efficient photodetector.

One or more embodiments provide a photodiode including an n-type section, a p-type section, and a laser treated semiconductor section. The laser treated semiconductor section may be disposed between the n-type section and the p-type section such that the n-type section and the p-type section can generate an electric field substantially capable of depleting at least a portion of the laser treated semiconductor section of free carriers and separating resulting electron-hole pairs generated in the laser treated semiconductor section. The laser treated semiconductor section may comprise a net doped n-type material and the n-type section may have a higher level of n-doping than the laser treated semiconductor section. Alternatively, the laser treated semiconductor section may comprise a net doped p-type material and the p-type section may have a higher level of p-doping than the laser treated semiconductor section. The photodiode may further comprise a pair of electrical contact points, one on either side of the laser treated semiconductor section. The photodiode may further comprise a substrate proximal to the laser treated semiconductor section and at least a pair of electrical contact points, one proximal to a face of the laser treated semiconductor section and the other proximal to a face of the substrate opposing the face of the laser treated semiconductor section. The photodiode may also comprise a substrate proximal to the laser treated semiconductor section and a plurality of electrical contact points disposed proximal to a face of the laser-treated semiconductor section. In some embodiments, the n-type section may partially enclose the p-type section and the laser treated semiconductor section. Alternatively, the p-type section may partially enclose the n-type section and the laser treated semiconductor section.

One or more embodiments provide a photodiode including a first Schottky contact, a second Schottky contact, and a laser treated semiconductor section. The laser treated semiconductor may be at least partially disposed between the first Schottky contact and the second Schottky contact. The first Schottky contact may have a higher work function than the second Schottky contact, such that the first Schottky contact and the second Schottky contact generate an electric field capable of substantially preventing to electron-hole pairs generated by the laser treated semiconductor section from recombining in at least some portion of the laser treated semiconductor section. The Schottky contacts may comprise a pair of electrical contact points, one on either side of the laser treated semiconductor section. The photodiode may further comprise a substrate proximal to the laser treated semiconductor section and the Schottky contacts comprising at least a pair of electrical contact points, one proximal to a face of the laser treated semiconductor section and the other proximal to a face of the substrate opposing the face of the laser treated semiconductor section. The photodiode may further comprise a substrate proximal to the laser treated semiconductor section and the Schottky contacts providing a plurality of electrical contact points disposed proximal to a face of the laser-treated semiconductor section. The first Schottky contact may partially enclose the second Schottky contact and the laser treated semiconductor section. Alternatively, the second Schottky contact may partially enclose the first Schottky contact and the laser treated semiconductor section.

One or more embodiments provide a photodiode including a first doped section, a second doped section, and a laser treated semiconductor section. The second doped section may be substantially bounded by the first doped section and the laser treated semiconductor section may be substantially bounded by the second doped section. The photodiode may further comprise a first and a second contact. The first contact may be coupled to the first doped section and the second contact may be coupled to the second doped section. The first doped section and the second doped section may be substantially annular and the laser treated section may be substantially disk shaped. The first doped section may be n doped and the second doped section may be p doped. Alternatively, the first doped section may be p doped and the second doped section may be n doped.

One or more embodiments provide a photodiode including a first doped section comprising at least one subsection, a second doped section comprising at least one subsection, a laser treated semiconductor section, and a substrate comprising a first side. The laser treated semiconductor section, first doped section and second doped section may be disposed on the first side of the substrate. The second doped section may be substantially bounded by the first doped section and the laser treated semiconductor section may be substantially bounded by the second doped section. The second doped section may comprise a first and a second subsection. The second doped section first and second subsections may be disposed on either side of the laser treated semiconductor section. The first doped section may comprise a first and a second subsection. The first doped section first and second subsections may be disposed on the opposite side of the second doped section first and second subsections from the laser treated semiconductor section.

One or more embodiments provide a photodiode including a first doped section comprising at least one subsection, a second doped section comprising at least one subsection, a laser treated semiconductor section, and a substrate comprising a first and second side. The laser treated semiconductor section and the first doped section may be disposed on the first side of the substrate. The second doped section may be disposed on the second side of the substrate. The laser treated semiconductor section may be substantially bounded by the first doped section. The first doped section may comprise a first and a second subsection being disposed on either side of the laser treated semiconductor section.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

For a fuller understanding of the nature and advantages of the present invention, reference is made to the following detailed description of preferred embodiments and in connection with the accompanying drawings, in which.

Figure 1:
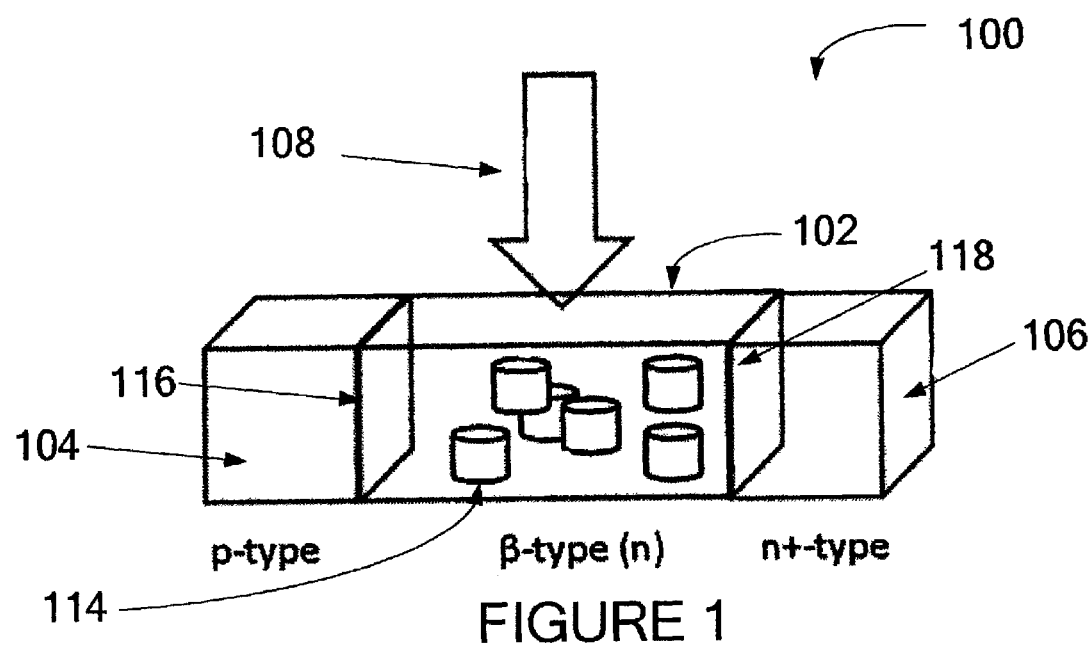
FIG. 1 illustrates an exemplary embodiment of a laser treated semiconductor diode where the laser treated semiconductor section is located between a p-n junction.

The drawings will be described further in connection with the following detailed description. Further, these drawings are not necessarily to scale and are by way of illustration only such that dimensions and geometries can vary from those illustrated.

DETAILED DESCRIPTION

Some or all embodiments hereof include a photodetection or photovoltaic device sensitive to certain electromagnetic wavelengths and formed on a semiconductor substrate. In some embodiments, the device includes a portion comprising a semiconductor material, for example silicon, which is irradiated by a short pulse laser to create modified micro-structured surface morphology. The laser processing can be the same or similar to that described in U.S. Pat. No. 7,057,256 to Carey et al., which is hereby incorporated by reference. The laser-processed semiconductor is made to have advantageous light-absorbing properties. In some cases this type of material has been called "black silicon" due to its visually darkened appearance after the laser processing and because of its enhanced absorption of light and IR radiation compared to other forms of silicon, however, the present description is not limited and comprehends other laser-treated semiconductor materials and resulting properties.

Generally, the wavelength of the irradiating laser pulse for making black silicon, its fluence, and pulse width can affect the morphology of the microstructured surface. In some embodiments, the laser fluence may be between about 1.5 $kJ/m^2$ and 12 $kJ/m^2$, but can vary depending on the substrate composition. The choice of the fluence of laser pulses irradiating a silicon wafer to generate a microstructured layer therein can also affect the gettering performance (capacity and/or specificity) of a microstructured substrate. In some embodiments hereof, the laser pulse fluence is selected to be greater than about 3 $kJ/m^2$. More preferably, the fluence may be chosen to be in a range of about 3 $kJ/m^2$ to about 10 $kJ/m^2$, or a range of about 3 $kJ/m^2$ to about 8 $kJ/m^2$.

Additionally, the laser pulse length can affect the morphology and absorption properties of the treated silicon. Irradiation of a substrate as described herein can be done with femtosecond laser pulses or picosecond or nanosecond pulses. Other factors that can affect microstructures morphology include laser polarization and laser propagation direction relative to the irradiated surface.

In some embodiments, the laser microstructuring of a substrate is performed in the presence of a mixture of two or more substances to accomplish the present purposes. For example, silicon samples treated in the presence of a mixture of $SF_6$ and $Cl_2$ exhibit an increase in the microstructure density at higher partial pressure of $SF_6$.

We now turn to a description of an exemplary apparatus for detecting electromagnetic radiation in at least a range of wavelengths of the electromagnetic spectrum and/or for generating current or voltage through the absorption of photons.

FIG. 1 illustrates an exemplary embodiment of a laser treated semiconductor diode 100 where the laser treated semiconductor section 102 is disposed between a p-section 104 and an n-section 106. The laser treated semiconductor section 102 absorbs photons from the illumination 108 and generates within the laser treated semiconductor section 102.

The p-section 104 and the n-section 106 generate an electric field that aids in depleting the laser treated semiconductor section 102 of free charge carriers and separating EHPs generated in the laser treated semiconductor section 102. Also, the laser treated semiconductor includes a plurality of quantum wells 114 that can trap electrons or holes, depending on the type of laser treatment used, creating additional free carriers. In an embodiment where the laser treated semiconductor section 102 is net n-type, the n-section 106 may be more n-type doped than the laser treated semiconductor section 102. Likewise, in an embodiment where the laser treated semiconductor section 102 is net p-type, the p-section 104 may be more p-type doped than the laser treated semiconductor section 102. The exemplary embodiment in FIG. 1 provides for a substantially uniform electric field and quantum confinement of the electrons. In the example shown, the two junctions (n+ type 106 to laser treated semiconductor 102 junction 116 and laser treated semiconductor 102 to p type 104 junction 118) are both reverse biased and the depletion section from each depletion section extends into both sides of each junction.

Figure 2:
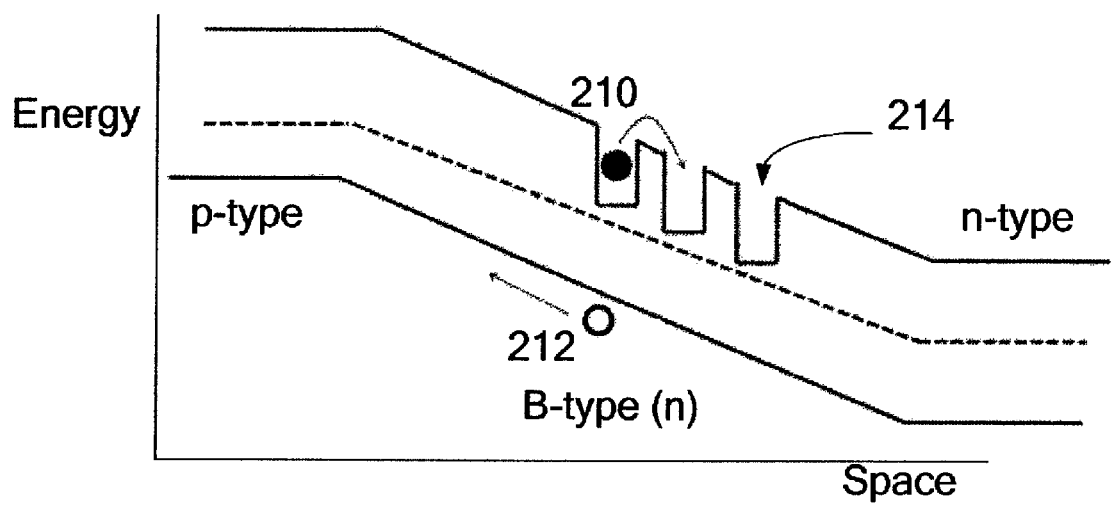
FIG. 2 models a laser treated semiconductor section that is reverse biased in energy space to illustrate quantum confinement of a charge species within quantum wells and the free drift of the other species in the depleted material.
Figure 3:
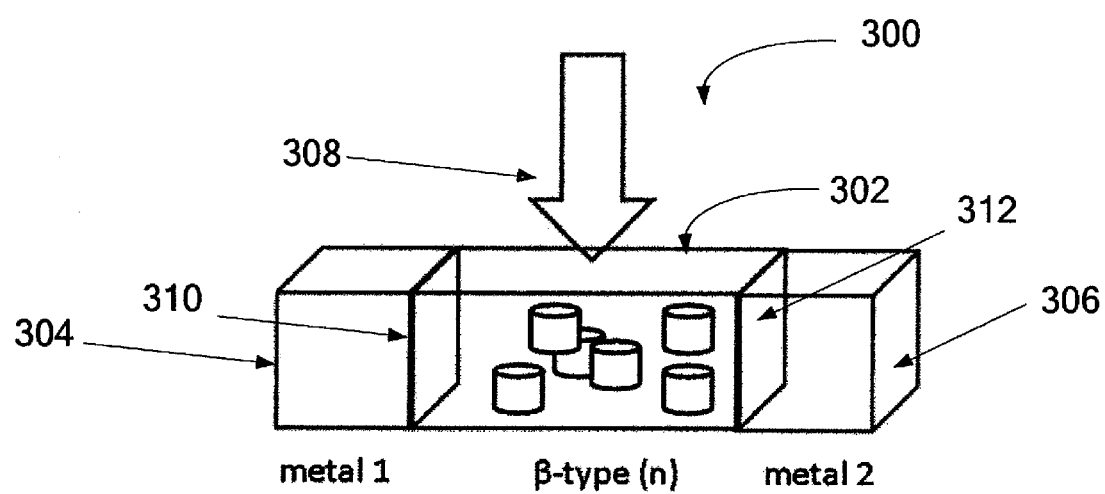
FIG. 3 illustrates an exemplary embodiment of a laser treated semiconductor diode where the laser treated semiconductor section is located between Schottky metal contacts.

FIG. 2 models a laser treated semiconductor section in energy space to illustrate quantum confinement of a charge species (either electrons or holes) within quantum wells 214 and the free drift of the other species in the depleted material. In this example, electrons 210 are trapped in quantum wells 214 coupled to the conduction band, allowing the holes 212 to freely drift. If desired, holes 212 may also be used as the trap species by changing the material used, in which case the electrons may freely drift. By trapping one species, enhanced photosensitivity is gained by the transport of many carriers of the freely drifting type. A dashed line is used to illustrate the Fermi energy FIG. 3 illustrates an exemplary embodiment of a laser treated semiconductor diode 300 where the laser treated semiconductor section 302 is located between a first 304 and second 306 Schottky contact. The laser treated semiconductor section 302 absorbs photons from the illumination 308 and generates electron-hole pairs within the laser treated semiconductor section 302. The first Schottky contact 304 and the second Schottky contact 306 may be engineered to create an energy hand structure that generates an electric field. The first Schottky contact 304 and the second Schottky contact 306 may be connected to the laser treated semiconductor section 302 to create metal semiconductor junctions 310 and 312. The electric field generated by the energy band structure separates the EHPs and prevents or reduces the likelihood of them recombining. In an exemplary embodiment the work function of the first Schottky contact 304 ($\Phi_{m1}$) is higher than the work function of the second Schottky contact 306 ($\Phi_{m2}$). The exemplary embodiment in FIG. 3 also provides for a uniform electric field and quantum confinement of the electrons.

Figure 4:
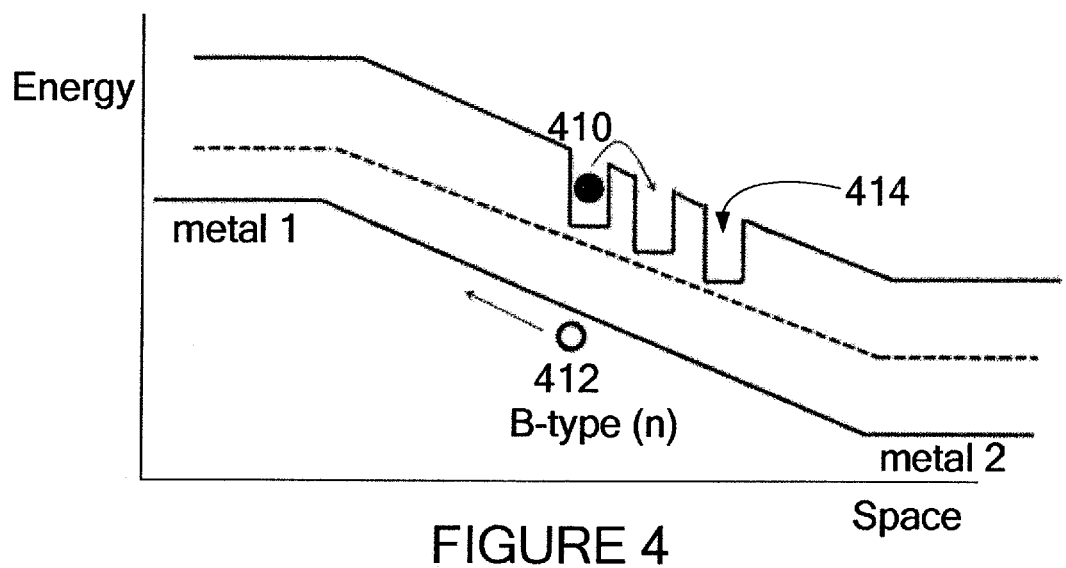
FIG. 4 models a laser treated semiconductor section under bias in energy space to illustrate quantum confinement of a charge species within quantum wells and the free drift of the other species in the depleted material.
Figure 5:
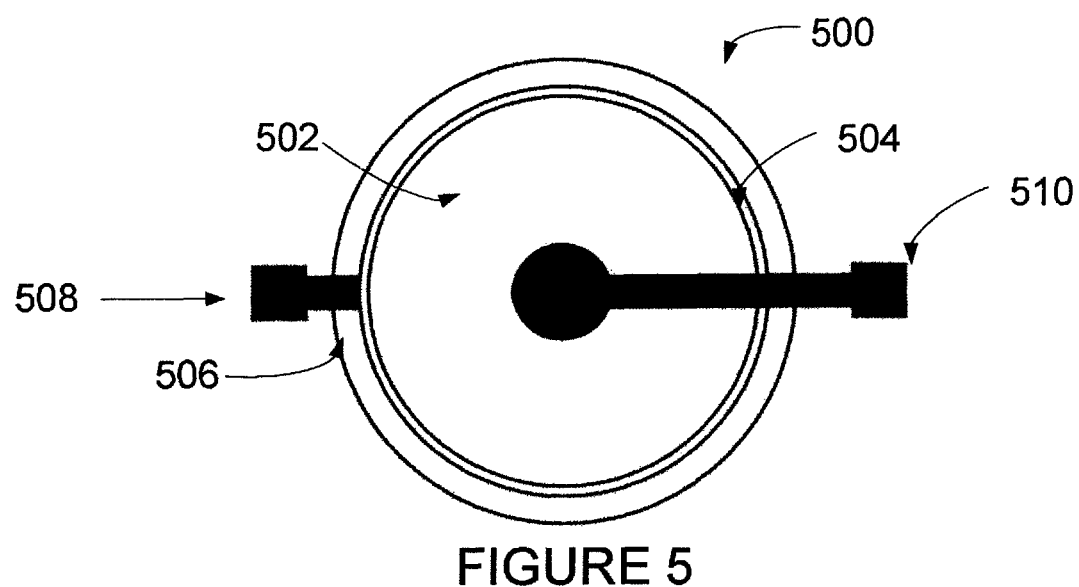
FIG. 5 illustrates an exemplary embodiment of a laser treated semiconductor diode using a lateral diode configuration.

FIG. 4 models a laser treated semiconductor section under bias in energy space to illustrate quantum confinement of a charge species (either electrons or holes) within quantum wells 414 and the free drift of the other species in the depleted material Similar to the charge flow in FIG. 2, metal semiconductor contacts can provide charge and an electric field across the laser doped material. In a metal semiconductor junction, majority carriers are injected into the semiconductor. By using a laser doped material with minority carrier trapping in a photodetector, a highly sensitive device may be obtained. In this example, the electrons 210 are trapped in the quantum wells 214, allowing the holes 212 to freely drift. A dashed line is used to illustrate the Fermi energy FIG. 5 illustrates an exemplary embodiment of a laser treated semiconductor diode 500 using a lateral diode configuration. A lateral diode has all of its connections on a single side of the device. One benefit to using a lateral configuration is its compatibility with the standard CMOS process flow. In one exemplary embodiment, the n-type 504 and p-type 506 layers are arranged in a substantially annular fashion around a substantially disk shaped laser treated semiconductor section 502. The n-type 504 layer may be connected to a contact 510. Alternatively, depending on the application, the laser treated semiconductor section 502 may be connected to a contact 510. The p-type layer 506 may be connected to the contact 508. In the pictured exemplary embodiment, the n-type layer 504 is connected to a contact 510 and the p-type layer 506 is connected to a contact 508 at or near the edge of the laser treated semiconductor section 502. The p-type layer 506 substantially bounds the n-type layer 504. Additionally, the n-type layer 504 substantially bounds the laser treated semiconductor section 502. The laser treated semiconductor used in the laser treated semiconductor section 502 provides a decreased optical absorption coefficient due to a combined effect from the increased optical path length from the nanocrystalline nature of the surface layer and the impurity state absorption of below band gap wavelengths. The decreased optical absorption coefficient allows a shallow junction device 500 to efficiently collect EHPs. In this embodiment, the electric field generated b the device extends laterally around the device, rather than into the depth of the laser treated semiconductor section 502. The lateral field provides a lower overall leakage current due to fewer bulk level defects within the substrate.

Figure 6:
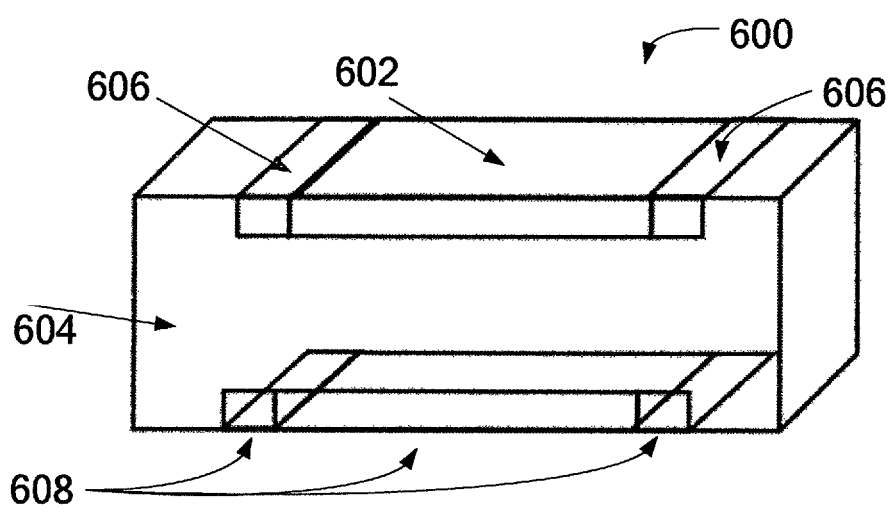
FIG. 6 illustrates an exemplary embodiment of a laser treated semiconductor diode using a vertical diode configuration.

FIG. 6 illustrates an exemplary embodiment of a laser treated semiconductor diode 600 using a vertical diode configuration. A vertical diode configuration has contacts (606 and 608) on both sides of the device. Potential benefits of the vertical diode configuration include: increased fill factor on the detection surface, stronger electrical fields between contacts resulting in increased EHP separation, greater absorption depth resulting in increased absorption efficiency. In one exemplary embodiment, a laser treated semiconductor section 602 may be disposed on a surface of a substrate 604 along with a p-doped section. The p-doped section may comprise at least one subsection (e.g., p-type contacts 606). The laser treated semiconductor section 602 may lie disposed between the p-type contacts 606. The substrate may be n-type doped and may include n-type contacts 608 on the opposite side of the substrate 604 from the laser treated semiconductor layer 602.

Figure 7:
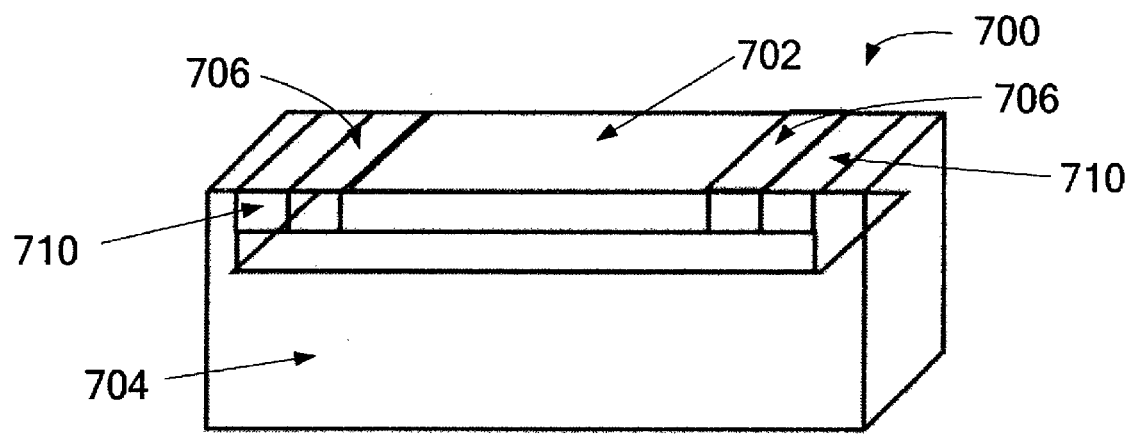
FIG. 7 illustrates another exemplary embodiment of a lateral diode configuration.

FIG. 7 illustrates another exemplary embodiment of a lateral diode configuration. In this embodiment, a laser treated semiconductor section 702 is disposed on the surface of a substrate 704 along with a p-doped section and an n-doped section. The p-doped section may comprise at least one subsection (e.g., p-type contacts 706). The n-doped section may comprise at least one subsection (e.g., n-type contacts 710). The laser treated semiconductor section 602 may be disposed between the p-type contacts 706. The substrate 704 may be n-type doped and include n-type contacts 710 on the same side of the substrate 704 as the laser treated semiconductor section 702. The laser treated section 702 may be substantially bounded by the p-type contacts 706. The p-type contacts 706 may be substantially bounded by the n-type contacts 710. By arranging the lateral diode configuration 700 such that the n-type contacts 710 and the p-type contacts 706 are in close proximity, the n-type 710 and p-type 706 layers will have a higher built in voltage than the n-type 710 to laser treated semiconductor 702 and p-type 706 to laser treated semiconductor-702 junctions. The high built-in voltage between the n-type 710 and p-type 706 layers allows the p-type 706 to laser treated semiconductor 702 to n-type 710 conduction path to dominate. The absorption of photons at the p-n junction will contribute to the lateral diode sensitivity. In some embodiments, to aid the absorption of longer length photons, the p-n junction may not be shielded with an opaque material. In the above diode embodiments, reversing the doping of the n-type and p-type contacts and/or reversing the Schottky metals may provide a similar functioning diode with a reversed electron flow.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure. The claims are intended to cover such modifications.

What is claimed is:

1. A photodiode device, comprising:
   a substrate;
   a first doped section formed at a side of the substrate;
   a second doped section formed at an opposite side of the substrate from the first doped section; and
   a laser treated semiconductor section adjacent to and in electrical contact with the first doped section such that the first doped region and the second doped region are positioned to generate an electric field substantially capable of depleting at least a portion of the laser treated semiconductor section of free carriers and separating resulting electron-hole pairs generated in the laser treated semiconductor section.

2. The device of claim 1, further comprising:
   a first contact coupled to the first doped section; and
   a second contact coupled to the second doped section.

3. The device of claim 1, wherein the first doped section and the second doped section are substantially annular and the laser treated section is substantially disk shaped.

4. The device of claim 1, wherein the first doped section is n-doped and the second doped section is p-doped.

5. The device of claim 4, wherein the laser treated semiconductor section includes a net doped n-type material and the n-doped first doped section has a higher level of n-doping than the laser treated semiconductor section.

6. The device of claim 1, wherein the laser treated semiconductor section includes a micro structured surface.

7. The device of claim 1, wherein the first doped section is a plurality of first doped sections.

8. The device of claim 7, wherein the plurality of first doped sections is located on multiple sides of the laser treated semiconductor section.

9. A photodiode device, comprising:
   a substrate;
   a first doped section formed at a side of the substrate;
   a second doped section formed at an opposite side of the substrate from the first doped section; and
   a microstructured surface adjacent to and in electrical contact with the first doped section such that the first doped region and the second doped region are positioned to generate an electric field substantially capable of separating electron-hole pairs generated in the microstructured surface and moving resulting carriers to an appropriate contact.

10. The device of claim 9, further comprising:
    a first contact coupled to the first doped section; and
    a second contact coupled to the second doped section.

11. The device of claim 9, wherein the first doped section and the second doped section are substantially annular and the microstructured surface is substantially disk shaped.

12. The device of claim 9, wherein the first doped section is n-doped and the second doped section is p-doped.

13. The device of claim 12, wherein the microstructured surface includes a net doped n-type material and the n-doped first doped section has a higher level of n-doping than the microstructured surface.

14. The device of claim 9, wherein the microstructured surface is a short pulse laser modified surface.

15. The device of claim 14, wherein the short pulse laser modified surface is modified with femtosecond laser pulses or picosecond laser pulses.

16. The device of claim 9, wherein the first doped section is a plurality of first doped sections.

17. The device of claim 16, wherein the plurality of first doped sections is located on multiple sides of the microstructured surface.

* * * * *